(12) United States Patent
Sun et al.

(10) Patent No.: US 10,192,094 B2
(45) Date of Patent: Jan. 29, 2019

(54) ULTRASONIC FINGERPRINT SENSOR PACKAGE, ULTRASONIC FINGERPRINT IDENTIFICATION DEVICE AND ELECTRONIC DEVICE

(71) Applicant: NANCHANG O-FILM BIO-IDENTIFICATION TECHNOLOGY CO., LTD., Nanchang (CN)

(72) Inventors: Wensi Sun, Nanchang (CN); Anpeng Bai, Nanchang (CN)

(73) Assignee: NANCHANG O-FILM BIO-IDENTIFICATION TECHNOLOGY CO., LTD, Nanchang (CN)

( * ) Notice: Subject to any disclaimer, the term of this patent is extended or adjusted under 35 U.S.C. 154(b) by 0 days.

(21) Appl. No.: 15/489,858

(22) Filed: Apr. 18, 2017

(65) Prior Publication Data
US 2018/0068148 A1    Mar. 8, 2018

(30) Foreign Application Priority Data

Sep. 5, 2016  (CN) .......................... 2016 1 0802611
Sep. 5, 2016  (CN) ..................... 2016 2 1037944 U

(51) Int. Cl.
*G06K 9/20*   (2006.01)
*G06K 9/00*   (2006.01)
(Continued)

(52) U.S. Cl.
CPC .......... *G06K 9/0002* (2013.01); *H01L 41/042* (2013.01); *H01L 41/0475* (2013.01); *H01L 41/0533* (2013.01); *H01L 41/1132* (2013.01)

(58) Field of Classification Search
CPC .................................................. G06K 9/0002
See application file for complete search history.

(56) References Cited

U.S. PATENT DOCUMENTS 9,607,203 B1 *   3/2017  Yazdandoost ........ A61B 5/1172
2005/0282310 A1 * 12/2005  Zhou .................... G06K 9/0002
                                                              438/107
(Continued)

FOREIGN PATENT DOCUMENTS

WO    WO-2017183879 A1 * 10/2017 ............... H04N 5/30

*Primary Examiner* — Brian Werner
(74) *Attorney, Agent, or Firm* — Hodgson Russ LLP

(57) ABSTRACT

The present disclosure discloses a package for an ultrasonic fingerprint sensor comprising: a substrate comprising a top surface and a plurality of first connecting electrodes formed on the top surface; a control chip arranged on the substrate and comprising a periphery-stepped upper surface facing away from the substrate, the periphery-stepped upper surface comprising a central upper surface and a peripheral lower surface surrounding and being lower than the central upper surface, the control chip comprising a plurality of second connecting electrodes formed on the central upper surface, and a plurality of third connecting electrodes formed on the peripheral lower surface connected to the second connecting electrodes; bonding wires configured to bond the first connecting electrodes to the third connecting electrodes; an ultrasonic transducer arranged on the control chip; and packing material configured to package the substrate, the bonding wires and the ultrasonic transducer as one module.

18 Claims, 3 Drawing Sheets

(51) Int. Cl.
*H01L 41/053* (2006.01)
*H01L 41/113* (2006.01)
*H01L 41/047* (2006.01)
*H01L 41/04* (2006.01)

(56) References Cited

U.S. PATENT DOCUMENTS

2014/0219521 A1* 8/2014 Schmitt ............... G06K 9/0002
                                                  382/124
2017/0147851 A1* 5/2017 Wang ................... G06K 9/0002

* cited by examiner

ULTRASONIC FINGERPRINT SENSOR PACKAGE, ULTRASONIC FINGERPRINT IDENTIFICATION DEVICE AND ELECTRONIC DEVICE

CROSS-REFERENCE TO RELATED APPLICATION

This application claims priority to and the benefit of Chinese Patent Application Nos. 201610802611.7 and 201621037944.7, both filed with the State Intellectual Property Office of P. R. China on Sep. 5, 2016. The entire contents of the above-identified applications are incorporated herein by reference.

FIELD

Embodiments of the present disclosure relate to ultrasonic fingerprint sensor technology, and more particularly to an ultrasonic fingerprint sensor package.

BACKGROUND

In the related art, an ultrasonic fingerprint sensor package includes a substrate, a control chip positioned on the substrate, and an ultrasonic transducer positioned on the control chip. The control chip is connected to the substrate and thus, cooperating with the substrate, configured to control the ultrasonic transducer to detect fingerprints using an ultrasound technology. At present, the control chip can be connected to the substrate by bonding wires, which does not facilitate to reduce size of the ultrasonic fingerprint sensor package. Alternatively, the control chip can be connected to the substrate by a through-silicon-vias technology, which is not benefit for reducing cost of the ultrasonic fingerprint sensor package.

SUMMARY

Embodiments of the present disclosure seek to solve at least one of the problems existing in the prior art to at least some extent.

Embodiments of a broad aspect of the present disclosure provide a package for an ultrasonic fingerprint sensor. The package, according to embodiments of the present disclosure comprises: a substrate comprising a top surface, wherein a plurality of first connecting electrodes are arranged on the top surface; a control chip is arranged on the substrate and comprises a periphery-stepped upper surface facing away from the substrate, the periphery-stepped upper surface comprises a central upper surface and a peripheral lower surface surrounding and being lower than the central upper surface, the control chip comprises a plurality of second connecting electrodes formed on the central upper surface, a plurality of third connecting electrodes formed on the peripheral lower surface and connected to the second connecting electrodes in a predetermined manner by a redistribution layer technique; bonding wires, wherein the bonding wires are configured to bond the first connecting electrodes to the third connecting electrodes by a wire bonding technique; an ultrasonic transducer is arranged on the control chip, wherein the transducer being controlled by the substrate and the control chip, is configured to transmit ultrasound and detect the ultrasound reflected back thereto; and packing material is configured to package the substrate, the control chip, the bonding wires, and the ultrasonic transducer as one module.

With the package, according to embodiments of the present disclosure, since the second connecting electrodes are higher than the third connecting electrodes in height, the increasing thickness of the control chip through the redistribution layer technique is less than it through the wire bonding technique. Such that the volume of the package is smaller, and the cost of bonding the control chip to the substrate by the wire bonding technique is lower.

In some embodiments of the present disclosure, the control chip comprises a lower surface, the package comprises a first adhesive layer, wherein the first adhesive layer is configured to connect the top surface of the substrate with the lower surface of the chip.

In some embodiments of the present disclosure, the first adhesive layer comprises diallyl fumarate adhesive or liquid non-conductive adhesive.

In some embodiments of the present disclosure, the positive projection of the control chip on the top surface of the substrate falls in the top surface of the substrate.

In some embodiments of the present disclosure, the substrate comprises a lower surface, opposite to the top surface of the substrate, the substrate comprises fourth connecting electrodes formed on the bottom surface of the substrate, wherein the substrate comprises pre-set circuit inside thereof being configure to connect the first connecting electrodes with the fourth connecting electrodes in a pre-set manner to achieve a pre-set function.

In some embodiments of the present disclosure, the fourth connecting electrodes comprise land grid array (LGA) pads.

In some embodiments, the fourth connecting electrodes is arranged inside the substrate.

In some embodiments of the present disclosure, the transducer comprises: a piezoelectric layer comprising an array of piezoelectric pillars; a plurality of the emitting electrodes formed beneath the piezoelectric layer, each emitting electrode is configured to connect to a corresponding piezoelectric pillar; a plurality of receiving electrode lines are formed on the piezoelectric layer, wherein each of the receiving electrode lines is configured to connect to a corresponding row of piezoelectric pillars.

In some embodiments of the present disclosure, the emitting electrode comprises connecting electrodes, wherein the connecting electrodes are being configured to connect with corresponding fifth connecting electrodes, which are formed on the top surface of the control chip.

In some embodiments of the present disclosure, the transducer is configured to bond to the control chip by a flip chip bonding technique.

In some embodiments of the present disclosure, the transducer comprises a top surface facing away from the substrate, wherein the top surface is on an even height with the packing material.

In some embodiments of the present disclosure, the dimension of the control chip is less than that of the substrate, and the control chip is aligned with the center of the substrate.

In some embodiments of the present disclosure, the package further comprises a second adhesive layer, wherein the second adhesive layer is configured to bond the transducer to the control chip.

In some embodiments of the present disclosure, the transducer further comprises an isolation layer, wherein the isolation layer is arranged between the piezoelectric pillars.

In some embodiments of the present disclosure, the material of the isolation layer comprises epoxy resin.

Embodiments of another broad aspect of the present disclosure provide an ultrasonic fingerprint identification device. The ultrasonic fingerprint identification device, according to embodiments of the present disclosure comprises the package for an ultrasonic fingerprint sensor.

Embodiments of another broad aspect of the present disclosure provide an electronic device. The electronic device, according to embodiments of the present disclosure comprises a casing and the ultrasonic fingerprint identification device positioned in the casing for fingerprint identification or authorization.

Additional aspects and advantages of embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
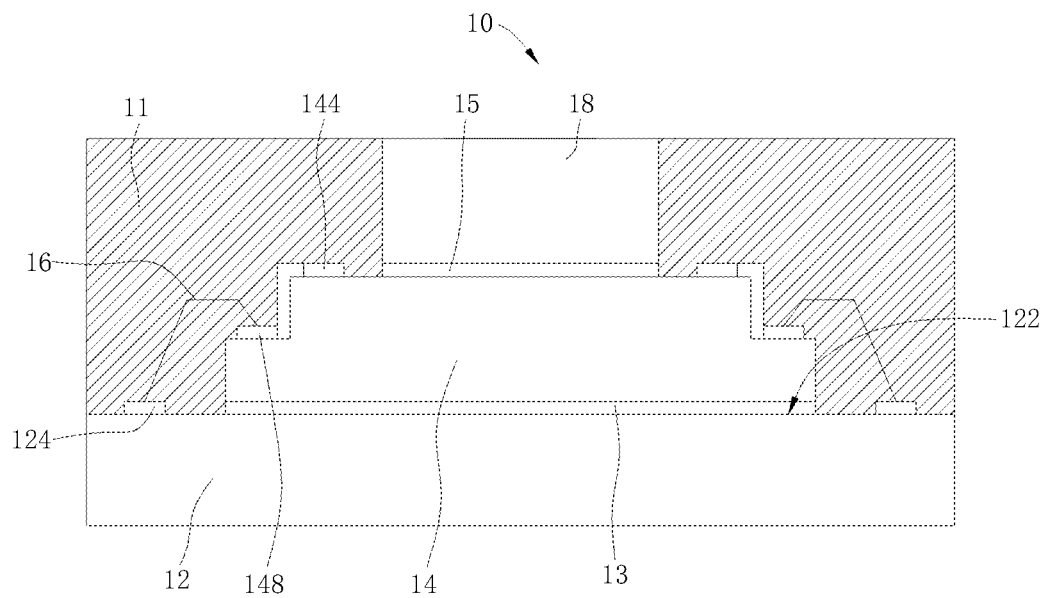
FIG. 1 is a schematic cross-sectional view of an exemplary package according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the specification, it should be understood that the terms such as "central", "longitudinal", "lateral", "width", "thickness", "above", "below", "front", "rear", "right", "left", "vertical", "horizontal", "top", "bottom", "inner", "outer", "clockwise", "counter-clockwise" should be construed to refer to the orientation as then described or as shown in the drawings. These terms are merely for convenience and concision of description and do not alone indicate or imply that the device or element referred to must have a particular orientation. Thus, it cannot be understood to limit the present disclosure.

In addition, terms such as "first" and "second" are used herein for purposes of description and are not intended to indicate or imply relative importance or significance or impliedly indicate quantity of the technical feature referred to. Thus, the feature formed with "first" and "second" may comprise one or more of these features. In the description of the present disclosure, "a plurality of" means two or more than two of these features, unless specified otherwise.

In the present invention, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

An ultrasonic fingerprint sensor package, according to embodiments of the present disclosure, may be described below with reference to FIGS. 1-5.

In some embodiments, as shown in FIG. 1, an ultrasonic fingerprint package 10 comprise a substrate 12, a control chip 14, a plurality of bonding wires 16, a transducer 18 and packing material 11. The substrate 12 comprising a top surface 122 and a plurality of first connecting electrodes 124 formed on the top surface 122. The control chip 14 is arranged on the substrate 12, wherein the control chip 14 comprises a periphery-stepped upper surface facing away from the substrate 12, the periphery-stepped surface comprises a central upper surface 141 facing away from the top surface 122 and a peripheral lower surface 143 surrounding and being lower than the central upper surface 141. A plurality of second connecting electrodes 144 are formed on the central upper surface 141, a plurality of third connecting electrodes 148 are formed on the peripheral lower surface 143, wherein the second connecting electrodes 144 are connected to the third connecting electrodes 148 in a predetermined manner by a redistribution layer technique. The bonding wires 16 are configured to bond the first connecting electrodes 124 to the third connecting electrodes 148 by a wire bonding technique. The ultrasonic transducer 18 is arranged on the control chip 14, wherein the transducer 18 being controlled by the substrate 12 and the control chip 14, is configured to emit ultrasound and detect the ultrasound reflected back thereto. The packing material 11 is configured to package the substrate 12, the control chip 14 and the bonding wires 16 as one module.

With the package 10, according to embodiments of the present disclosure, since the second connecting electrodes 144 are higher than the third connecting electrodes 148 in height, the increasing thickness of the control chip 14 through the redistribution layer technique is less than it through the wire bonding technique. Such that the size of the package 10 can be reduced, and the cost of bonding the control chip 14 to the substrate 12 by the wire bonding technique also can be reduced.

In some embodiments, the substrate 12 can be a printed circuit board or a semiconductor substrate, such as a silicon substrate with pre-set circuits.

In some embodiments, the control chip 14 comprises a chip lower surface 142. The package 10 comprises a first adhesive layer 13, wherein the first adhesive layer 13 is configured to connect the top surface 122 with the lower surface 142 of the chip.

In other words, the control chip 14 is fixed on the substrate 12 by the first adhesive layer 13. The package has a simpler structure, and is easy to be manufactured. Thus, the cost of the package 10 is further reduced. Meanwhile, the first adhesive layer 13 makes the connection between the control chip 14 and the substrate 12 occupy a small space. Thus, the package 10 can be reduced in size.

In some embodiments, the control chip 14 can be connected to the substrate 12 by the other ways, or the packaging material 11 makes the control chip 14 and the substrate 12 fit closely together.

In some embodiments, the first adhesive layer 13 comprises diallyl fumarate adhesive or liquid non-conductive adhesive.

Such that, good adhesive performance of the first adhesive layer 13 makes the control chip 14 connect to the substrate 12 more tight. During mass production, the above-mentioned adhesive connection between the control chip 14 and the substrate 12 has a lower cost, and reduce the cost of the package 10.

In other embodiments, the material of the first adhesive layer 13 is not limited to those of the above-described embodiments.

In some embodiments, the positive projection of the control chip 14 on the top surface 122 of the substrate falls in the top surface 122 of the substrate.

Thus, the packaging material 11 can contact with the top surface 122, thereby increasing the packing intensity of the packaging material 11.

In some embodiments, the dimension of the control chip 14 is less than that of the substrate 12. The control chip 14 is aligned with the center of the substrate 12, so that the positive projection of the control chip 14 on the substrate top surface 122 falls in the substrate top surface 122.

Figure 2:
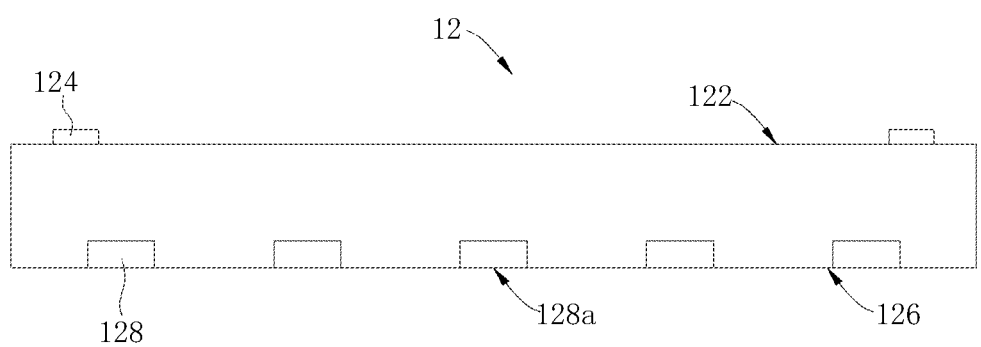
FIG. 2 is a schematic cross-sectional view of an exemplary substrate according to an embodiment of the present disclosure.

As shown in FIG. 2, in some embodiments, the substrate 12 includes a lower surface 126. The lower surface 126 is opposite to the top surface 122. The substrate 12 comprises fourth connection electrodes 128 formed on the lower surface 126. The substrate 12 comprises pre-set circuits inside thereof. The pre-set circuits inside the substrate 12 are connected to the first connection electrodes 124 and the fourth connection electrodes 128 in a pre-set manner to achieve a pre-set function.

The substrate 12 is configured to supply connection points for an external circuit (not shown), so that the external circuit can be connected to the substrate 12 by the fourth connection electrodes 128. In other words, the arrangement of the fourth connection electrodes 128 makes the package 10 connect to the external circuit.

In some embodiments, the fourth connection electrodes 128 are land grid array (LGA) pads.

Thus, the Surface Mount Technology (SMT) technique can be used in the connection between the fourth connection electrodes 128 and the external circuit. The substrate 12 and the external circuit can be connected by contact points to avoid a welding method, thereby facilitating the mounting, disassembly, and replacement of the package 10.

In some embodiments, the fourth connection electrodes 128 are arranged inside the substrate 12. A sidewall 128*a* of each fourth connection electrodes 128, which is away from the substrate 12, is on an even height with the lower surface 126.

It could be understood that the location relationship between the fourth connection electrodes 128 and the lower surface 126 is not limited to those of the above-discussed embodiments.

Figure 4:
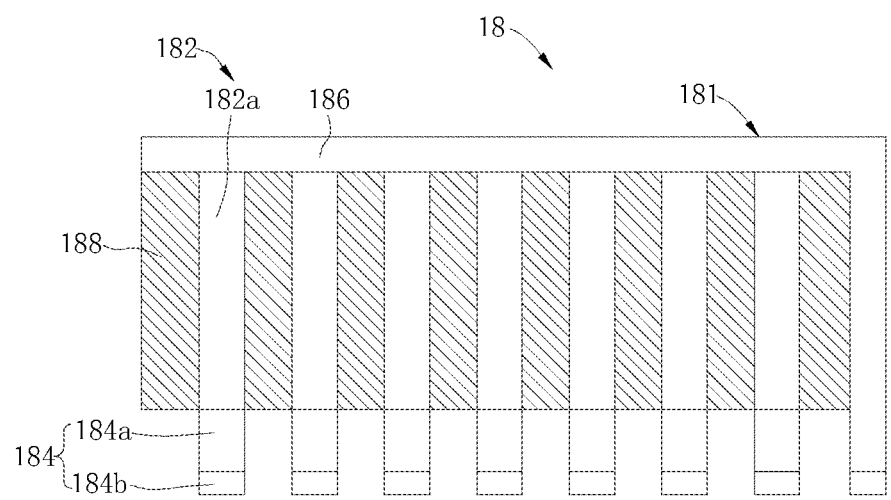
FIG. 4 is a schematic cross-sectional view of an exemplary transducer according to an embodiment of the present disclosure.
Figure 5:
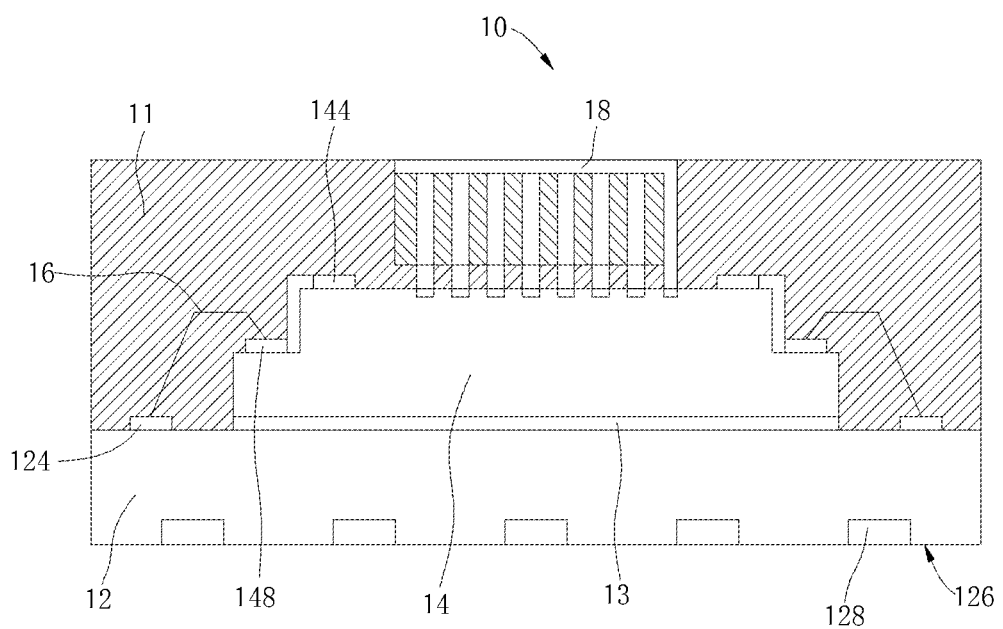
FIG. 5 is a schematic cross-sectional view of another exemplary package according to an embodiment of the present disclosure.

As shown in FIG. 4 and FIG. 5, in some embodiments, the transducer 18 includes a piezoelectric layer 182, a plurality of emitting electrodes 184, and a plurality of receiving electrode lines 186. The piezoelectric layer 182 includes an array of piezoelectric pillars 182*a*. The emitting electrodes 184 are formed beneath the piezoelectric layer 182, each emitting electrode 184 is configured to connect to a corresponding piezoelectric pillar 182*a*. The receiving electrode lines 186 are formed on the piezoelectric layer 182, each of the receiving electrode lines 186 is configured to connect to a corresponding row of piezoelectric pillars 182*a*.

The emitting electrodes 184 can individually excite a certain piezoelectric pillar 182*a* rather than a plurality of piezoelectric pillars 182*a* which can produce a big lateral noise, thereby ensuring that the transducer 18 can more accurately identify the fingerprint. At the same time, since the power of the point excitation is small, the energy consumption of the transducer 18 is small. Moreover, the emitting electrodes 184 can be adhered to the control chip 14 by a point-to-point adhesion.

In some embodiments, an isolation layer 188 is arranged between the piezoelectric pillars 182*a*. The material of the isolation layer 188 may be epoxy resin.

The gap between the piezoelectric pillars 182 can be filled with the isolation layer 188, thereby preventing the piezoelectric pillars 182*a* from affecting the ultrasound transmission and reception, and further reducing the lateral noise.

In some embodiments, the emitting electrodes 184 formed as an alloy layer 184*a*. The material of the alloy layer 184*a* may comprise copper, nickel, silver, or the like. Thus, the emitting electrodes 184 can have a good electrical conductivity.

In some embodiments, the emitting electrodes 184 further includes a plurality of metal pads 184*b* arranged under the alloy layer 184*a*. Such that, the entire transducer 18 can be block up by the metal pads 184*b* so that the emitting electrodes 184 can be easily connected to the control chip 14.

Figure 3:
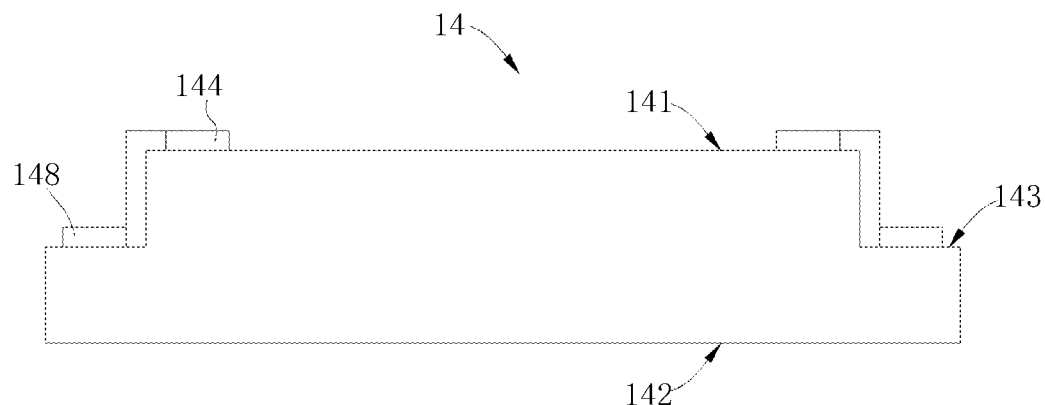
FIG. 3 is a schematic cross-sectional view of an exemplary control chip according to an embodiment of the present disclosure.

As shown in FIG. 3, in some embodiments, a connecting electrode (not shown) is arranged on each of the emitting electrodes 184. The control chip 14 includes a top surface 146 and a plurality of fifth connection electrodes (not shown) formed on the top surface 146. The connecting electrodes are connected to the fifth connection electrodes. Thus, the transducer 18 and the control chip 14 can fit closely together, thereby realizing the stable electrical connection.

As shown in FIG. 5, in some embodiments, the fifth connection electrodes are arranged inside the control chip 14. The control chip 14 defines a plurality of holes above the corresponding fifth connecting electrodes. The connecting electrodes are embedded in the holes. Thus, the connecting electrodes can be easily connected to the fifth connecting electrodes.

It could be understood that, in other embodiments, the location relationship between the fifth connection electrodes and the control chip 14 is not limited to those of the above-discussed embodiments.

In some embodiments, the control chip 14 comprises pre-set circuits inside thereof. The pre-set circuits inside the control chip 14 are connected to the second connecting electrodes 144 and the fifth electrodes connecting electrodes in a pre-set manner to achieve a pre-set function.

The control chip 14 is configured to supply contact points for the transducer 18, so that the transducer 18 can be connected to the control chip 14 by the fifth connection electrodes.

In some embodiments, the control chip 14 may be an Application Specific Integrated Circuit (ASIC), and is configured to control the transducer 18.

In some embodiments, the transducer 18 is configured to bond to the control chip 14 by a flip chip mounting technique. Thus, the transducer 18 can be tight attached to the control chip 14. The connection between the control chip 14 and the transducer 18 occupies a small space, and the ultrasonic fingerprint sensor package 10 can be reduced in size. Meanwhile, the electrical connection between the control chip 14 and the transducer 18 has a higher stability.

As shown in FIG. 1, in some embodiments, the package 10 comprises a second adhesive layer 15. The second adhesive layer 15 adheres the transducer 18 to the control chip 14. Thus, the transducer 18 can be tight attached to and steadily fixed on the control chip 14.

In some embodiments, the material of the second adhesive layer 15 is the same as that of the first adhesive layer 13, thereby making the package 10 be easier packaged and reducing the adhesion cost of the package 10.

In some embodiments, the transducer 18 includes a top surface 181 being away from the substrate 12. The packaging material 11 is coplanar with the top surface 181. The packaging material 11 reduces the contact between the transducer 18 and outside, thereby protecting the transducer 18.

In some embodiments, the package 10 can be substantially a cube. The cube has a more compact structure. It could be understood that the package 10 is not limited to be a cube, the ultrasonic fingerprint sensor package 10 can also be a cylinder, a triangular prism, and the like.

In some embodiments, the packing material 11 may be epoxy resin. Since the epoxy resin, on the surface of metal and non-metallic material, has excellent bonding strength, good dielectric property, small deformation shrinkage, good stability of the dimension, high hardness, good flexibility, and stability for alkali and most solvents, and the like characteristics, the packing material 11 working as a packing medium make the ultrasonic fingerprint sensor package 10 more stable.

In some embodiments, the packing material 11 may be other non-conductive material, or other non-piezoelectric material. It could be understood that the packing material 11 is not limited to those of the above-discussed embodiments.

In some embodiments, an ultrasonic fingerprint identification device comprises the package 10.

In some embodiments, an electronic device such as a smartphone, a laptop, a tablet, or a TV, includes the ultrasonic fingerprint identification device.

In this embodiment, the electronic device is a smartphone. In addition to the ultrasonic fingerprint identification, the electronic device further includes a casing and a display fixed to a front surface of the casing. The ultrasonic fingerprint identification device can be positioned in the casing, e.g., beneath the display, for fingerprint identification or authorization.

In this present disclosure, unless indicated otherwise, a structure in which a first feature is "on" or "underneath" a second feature may include an embodiment in which the first feature directly contacts the second feature and may include an embodiment in which an additional feature is prepared between the first feature and the second feature so that the first feature does not directly contact the second feature. Furthermore, a structure in which a first feature is "on" or "above" a second feature may include an embodiment in which the first feature is right above or inclined above the second feature and may include an embodiment in which the first feature is higher than the second feature. A structure in which a first feature is "under" or "below" a second feature may include an embodiment in which the first feature is right under or inclined under the second feature and may include an embodiment in which the first feature is lower than the second feature.

Reference throughout this specification to "an embodiment," "some embodiments," "an illustrated embodiment", "an example," "a specific example," or "some examples," means that a particular feature, structure, material, or characteristic described in connection with the embodiment or example is included in at least one embodiment or example of the present disclosure. The schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. A package of an ultrasonic fingerprint sensor comprising:
    a substrate comprising a top surface and a plurality of first connecting electrodes formed on the top surface;
    a control chip arranged on the substrate and comprising a periphery-stepped upper surface facing away from the substrate, the periphery-stepped upper surface comprising a central upper surface and a peripheral lower surface surrounding and being lower than the central upper surface, the control chip comprising a plurality of second connecting electrodes formed on the central upper surface, a plurality of third connecting electrodes formed on the peripheral lower surface and connected to the second connecting electrodes in a predetermined manner by a redistribution layer technique;
    a plurality of bonding wires, wherein the bonding wires are configured to bond the first connecting electrodes to the third connecting electrodes by a wire bonding technique;
    an ultrasonic transducer being arranged on the control chip, wherein the transducer, being controlled by the substrate and the control chip, is configured to emit ultrasound and detect the ultrasound reflected back thereto; and
    packing material, wherein the packing material is configured to package the substrate, the control chip, the bonding wires, and the ultrasonic transducer as one module.

2. The package of claim 1, wherein the control chip comprises a lower surface, the package comprises a first adhesive layer, wherein the first adhesive layer is configured to connect the top surface of the substrate with the lower surface of the control chip.

3. The package of claim 2, wherein the first adhesive layer comprises diallyl fumarate adhesive or liquid non-conductive adhesive.

4. The package of claim 1, wherein the positive projection of the control chip on the top surface of the substrate falls in the top surface of the substrate.

5. The package of claim 1, wherein the substrate comprises a lower surface, opposite to the top surface of the substrate, the substrate comprises fourth connecting electrodes formed on the lower surface of the substrate, wherein the substrate comprises pre-set circuit inside thereof being configure to connect the first connecting electrodes with the fourth connecting electrodes in a pre-set manner to achieve a pre-set function.

6. The package of claim 5, wherein the fourth connecting electrodes comprise land grid array (LGA) pads.

7. The package of claim 6, wherein the fourth connecting electrodes is arranged inside the substrate.

8. The package of claim 1, wherein the transducer comprises:
    a piezoelectric layer comprising an array of piezoelectric pillars;
    a plurality of the emitting electrodes formed beneath the piezoelectric layer, wherein each emitting electrode is configured to connect to a corresponding piezoelectric pillar; and
    a plurality of receiving electrode lines formed on the piezoelectric layer, wherein each of the receiving electrode lines is configured to connect to a corresponding row of piezoelectric pillars.

9. The package of claim 8, wherein the emitting electrode comprises connecting electrodes, wherein the connecting electrodes are being configured to connect with corresponding fifth connecting electrodes, which are formed on a top surface of the control chip.

10. The package of claim 9, wherein the transducer is configured to bond to the control chip by a flip chip bonding technique.

11. The package of claim 1, wherein the transducer comprises a top surface facing away from the substrate, wherein the top surface is on an even height with the packing material.

12. The package of claim 1, wherein the dimension of the control chip is less than that of the substrate, and the control chip is aligned with the center of the substrate.

13. The package of claim 1, wherein the package further comprises a second adhesive layer, wherein the second adhesive layer is configured to bond the transducer to the control chip.

14. The package of claim 8, wherein the transducer further comprises an isolation layer, wherein the isolation layer is arranged between the piezoelectric pillars.

15. The package of claim 14, wherein the material of the isolation layer comprises epoxy resin.

16. An ultrasonic fingerprint identification device, comprising a package for an ultrasonic fingerprint sensor of claim 1.

17. An electronic device, comprising:
    a casing; and
    the ultrasonic fingerprint identification device of claim 16 positioned in the casing for fingerprint identification or authorization.

18. The package of claim 6, wherein the fourth connection electrodes are arranged inside the substrate, and a sidewall of each fourth connection electrodes, which is away from the substrate, is on an even height with the lower surface.

* * * * *